US012658890B2

(12) United States Patent     (10) Patent No.:   US 12,658,890 B2

Ebihara et al.     (45) Date of Patent:    Jun. 16, 2026

(54) LADDER-TYPE FILTER, AND DUPLEXER AND MODULES WITH LADDER-TYPE FILTER

(71) Applicant: Sanan Japan Technology Corporation, Tokyo (JP)

(72) Inventors: Hitoshi Ebihara, Tokyo (JP); Shinichi Shioi, Tokyo (JP)

(73) Assignee: Sanan Japan Technology Corporation, Tokyo (JP)

( * ) Notice: Subject to any disclaimer, the term of this patent is extended or adjusted under 35 U.S.C. 154(b) by 154 days.

(21) Appl. No.: 18/490,544

(22) Filed: Oct. 19, 2023

(65) Prior Publication Data

US 2024/0137007 A1     Apr. 25, 2024
    US 2024/0235528 A9     Jul. 11, 2024

(30) Foreign Application Priority Data

Oct. 20, 2022    (JP) ................................. 2022-168654

(51) Int. Cl.
| | |
|---|---|
| *H03H 9/70* | (2006.01) |
| *H03H 9/54* | (2006.01) |
| *H03H 9/60* | (2006.01) |
| *H03H 9/64* | (2006.01) |
| *H03H 9/72* | (2006.01) |
| *H04B 1/20* | (2006.01) |

(52) U.S. Cl.
CPC ............ *H03H 9/706* (2013.01); *H03H 9/542* (2013.01); *H03H 9/605* (2013.01); *H03H 9/6483* (2013.01); *H03H 9/725* (2013.01); *H04B 1/20* (2013.01)

(58) Field of Classification Search
CPC ...... H03H 9/706; H03H 9/6483; H03H 9/725; H03H 9/568; H03H 9/605; H03H 9/46; H03H 9/02551; H03H 9/02614; H03H 9/125; H04B 1/20
See application file for complete search history.

(56) References Cited

U.S. PATENT DOCUMENTS

| | | | | |
|---|---|---|---|---|
| 10,784,839 | B2 * | 9/2020 | Kim | H03H 9/54 |
| 11,528,009 | B2 * | 12/2022 | Urata | H03H 9/0557 |
| 2016/0218696 | A1 * | 7/2016 | Nosaka | H03H 9/6423 |
| 2017/0294896 | A1 * | 10/2017 | Nosaka | H03H 9/6483 |
| 2019/0036508 | A1 * | 1/2019 | Tsukamoto | H04B 1/0475 |

FOREIGN PATENT DOCUMENTS

| | | |
|---|---|---|
| JP | 2018067874 A | 4/2018 |
| JP | 2021034745 A | 3/2021 |

* cited by examiner

*Primary Examiner* — John W Poos
(74) *Attorney, Agent, or Firm* — Dorsey & Whitney LLP

(57) ABSTRACT

A ladder-type filter includes a plurality of series arms and a plurality of parallel arms, in which one of the parallel arms does not have resonance characteristic is arranged in parallel between two series arm resonators of the plurality of series arms. The ladder-type filter may be included in a duplexer and/or a module.

8 Claims, 3 Drawing Sheets

LADDER-TYPE FILTER, AND DUPLEXER AND MODULES WITH LADDER-TYPE FILTER

CROSS-REFERENCE TO RELATED APPLICATION(S)

This application claims priority to Japanese Application No. 2022-168654, filed Oct. 20, 2022, which are incorporated herein by reference, in their entirety, for any purpose.

BACKGROUND OF THE INVENTION

Field of the Invention

The present disclosure relates to a ladder-type filter, and a duplexer and a module including the ladder-type filter.

Background Art

Recent technological developments have made mobile communication terminals as typified by smartphones remarkably miniaturized and lightened. The ladder-type filter used in such mobile communication terminals is required to be miniaturized. In addition, a communication system that simultaneously transmits and receives data is rapidly increasing as a mobile communication system. As a result, a demand for a duplexer is rapidly increasing.

Along with changes in mobile communication systems, requirements for ladder-type filters, and duplexers and modules including the ladder-type filters have become more stringent. This requires the ladder-type filter more miniaturized than in the conventional technique, and the duplexer and the module having the ladder-type filter. However, in a case where the ladder-type filter is miniaturized, the size of a surface acoustic wave (SAW) resonator must be miniaturized, and power durability is reduced.

An electrode of the SAW resonator is repeatedly subjected to the internal stresses according to applied voltage and a frequency. It causes the problem that the properties are significantly deteriorated because metallic atoms constituting the electrode by a stress tend to diffuse and move along grain boundaries and cause a short circuit due to the generation of protrusions or a disconnection due to the generation of voids. This phenomenon is commonly referred to as stress migration. Therefore, it is necessary to downsize the ladder-type filter without reducing a power durability of the ladder-type filter.

Patent Document 1 (JP2018-67874) discloses a technique of dividing SAW resonator in series in order to improve the power durability.

However, in the technology disclosed in Patent Document 1, it is impossible to keep the floor level low while maintaining the miniaturization without causing the problem of power durability with a simple configuration using fewer elements. It is necessary for the ladder-type filter to increase the number of stages of the ladder in order to keep the floor level low. Increasing the number of stages involves an increase in size.

In addition, it is accompanied by further enlargement to perform a series division in order to ensure the power durability of parallel resonators having an increased number of stages.

SUMMARY OF THE INVENTION

Some examples described herein may address the above-described problems. Some examples described herein may have an object to provide a ladder-type filter capable of keeping a floor level low while maintaining miniaturization without causing a problem of power durability with a simple configuration using fewer elements, and a module including the ladder-type filter.

In some examples, a ladder-type filter includes a plurality of series arms and a plurality of parallel arms, in which one of the parallel arms does not have resonance characteristic is arranged in parallel between 2 series arm resonators of the plurality of series arms.

BRIEF DESCRIPTION OF THE DRAWING

FIG. 3 is a diagram illustrating a piezoelectric thin film resonator used in an acoustic wave filter as an example of the ladder-type filter 1.

FIG. 4 is a schematic view of the ladder-type filter 2 according to a second embodiment.

FIG. 5 is a longitudinal cross-sectional view of a duplexer according to a third embodiment.

FIG. 6 is a longitudinal cross-sectional view of a module that the ladder-type filter according to the first embodiment is applied to.

DETAILED DESCRIPTION

Figure 1:
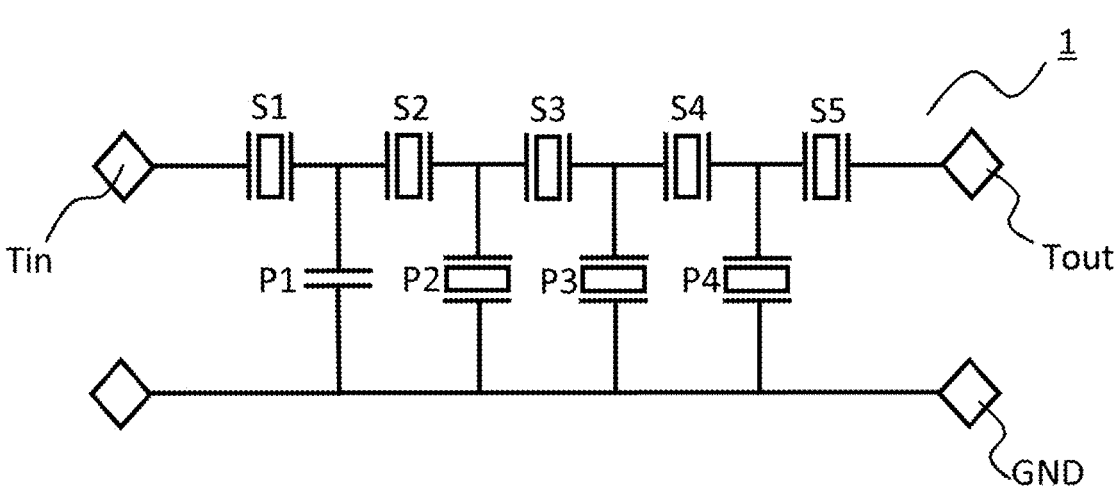
FIG. 1 is a schematic view of a ladder-type filter 1 according to a first embodiment.

The embodiments will be described with reference to the accompanying drawings. In the drawings, the same or corresponding parts are denoted by the same reference numerals. Duplicate descriptions of such portions may be simplified or omitted.

EMBODIMENT

First Embodiment

FIG. 1 is a schematic view of a ladder-type filter 1 according to the embodiment 1. As shown in FIG. 1, the ladder-type filter 1 includes a plurality of series arms S1 to S5 and a plurality of parallel arms P1 to P4. Further, an input-terminal Tin and an output-terminal Tout are provided.

The series arms S1 to S5 are resonators having resonance properties. One end of each of the plurality of parallel arms P1 to P4 is connected in parallel to a wiring connecting electrically the plurality of series arms. The other end is connected to the ground GND.

Parallel arm P1 does not have resonance properties. The parallel arm P1 is, for example, a capacitor. The parallel arm P1 may be a capacitor including, for example, Interdigital Capacitor (IDC). The capacitance of the parallel arm P1 is, for example, 1 pF. Parallel arms P2 to P4 are resonators having resonance properties.

The series arm S1 or the series arm S2 connected in parallel to the parallel arm P1 may be a series resonator having the highest resonant frequency among the series arms.

The series arm S1 connected in parallel to the parallel arm P1 is a series resonator to which an electrical signal is firstly applied among the series arms.

The ladder-type filter 1 in the first embodiment can be, for example, a ladder-type filter starting in series. By using the ladder-type filter starting in series, the floor level can be kept low while securing the power durability without increasing the number of stages of the ladder type filter.

In the case of a ladder-type filter starting in parallel, a large current is applied to the series resonator which a current is applied to firstly among the series arms. It is accompanied by enlargement arranging the parallel arm P1 having no resonance property while ensuring a minimum number of stages The input terminal Tin receives, for example, an input of a transmission signal of a communication device that the ladder-type filter 1 is mounted on. The ladder-type filter 1 passes only an electrical signal of a desired frequency band among the transmission signals. The output terminal Tout is connected to, for example, an antenna terminal of the communication device that the ladder-type filter 1 is mounted on.

Figure 2:
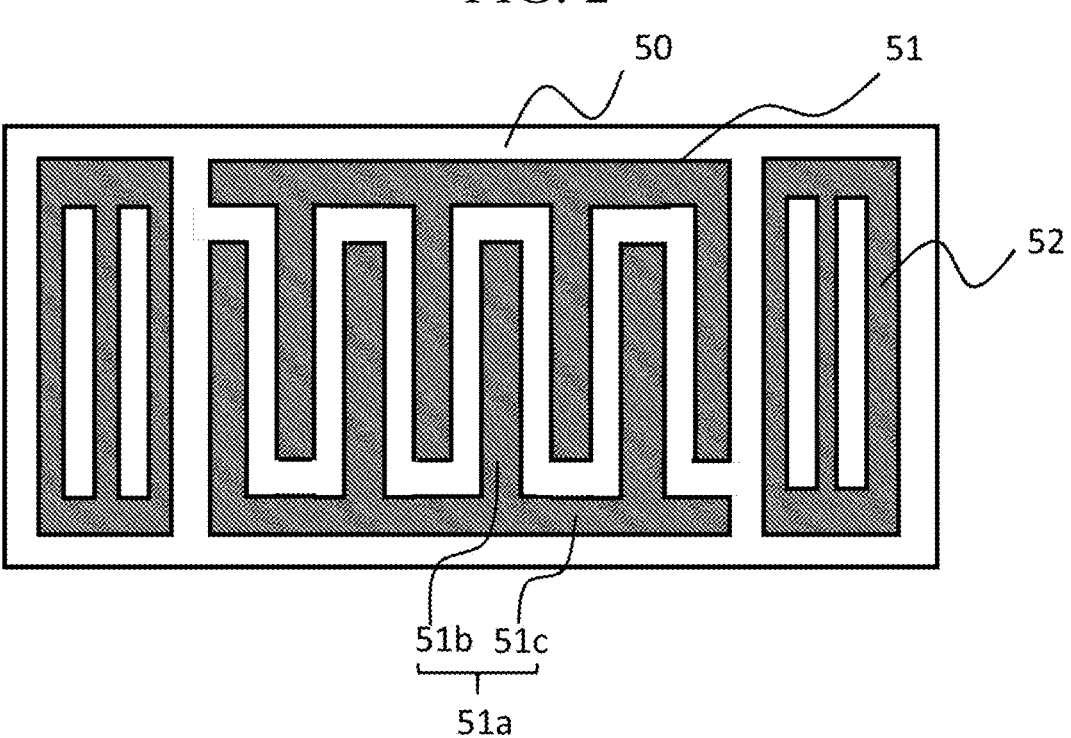
FIG. 2 is a diagram illustrating a surface acoustic wave resonator used in a surface acoustic wave filter as an example of the ladder-type filter 1.

FIG. 2 is a diagram illustrating a surface acoustic wave resonator used in a surface acoustic wave filter as an example of the ladder-type filter 1. The surface acoustic wave resonator includes an Interdigital Transducer (IDT) 51 and a pair of reflectors 52 on a piezoelectric substrate 50. IDT 51 has a pair of comb-electrode 51a arranged opposite each other.

According to one example, the comb-shaped electrode 51a includes a plurality of electrode fingers 51b and a busbar 51c connecting the plurality of electrode fingers 51b. The reflectors 52 are provided on both sides of the IDT 51 so as to sandwich the IDT 51. The IDT 51 excites the surface acoustic wave.

The piezoelectric substrate 50 is, according to one example, a lithium tantalate substrate or a lithium niobate substrate. According to one example, the IDT 51 and the reflector 52 are formed of an aluminum film or a copper film.

According to an example, the piezoelectric substrate 50 may be bonded to a support substrate such as a sapphire substrate, an alumina substrate, a spinel substrate, or a silicon substrate. In this regard, a protective film or a temperature-compensating film covering the IDT 51 and the reflector 52 may be provided.

Figures 3, 4:
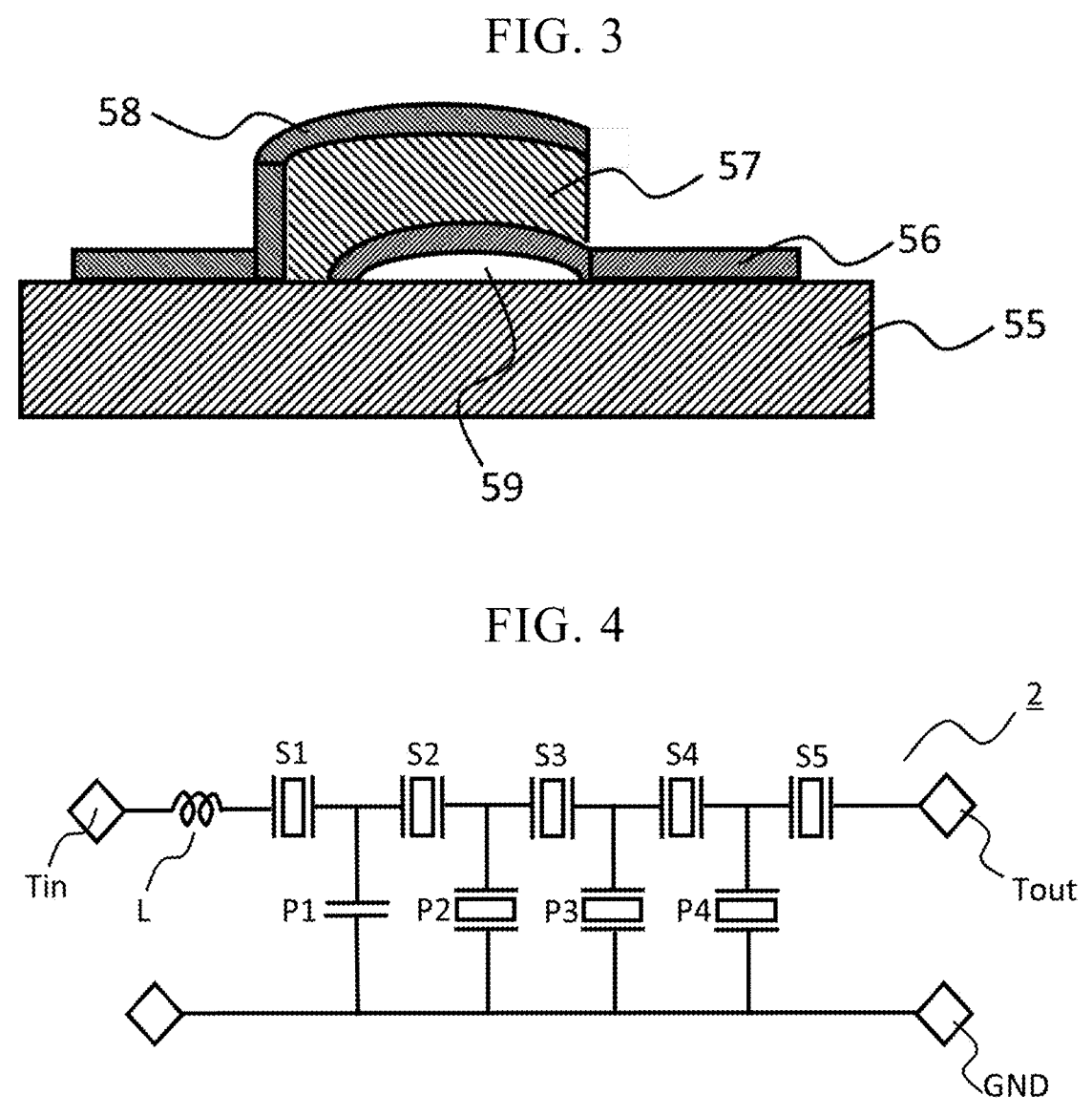

FIG. 3 is a diagram illustrating a piezoelectric thin film resonator used in an acoustic wave filter as an example of the ladder-type filter 1. The piezoelectric thin film resonator includes a piezoelectric film 57 on a substrate 55. So as to sandwich the piezoelectric film 57, a lower electrode 56 and an upper electrode 58 are provided. Between the lower electrode 56 and the substrate 55, a gap 59 is formed. The lower electrode 56 and the upper electrode 58 excite an elastic wave in a thickness extensional vibration mode inside the piezoelectric film 57.

According to an example, the lower electrode 56 and the upper electrode 58 are metal films such as ruthenium films. According to an example, the piezoelectric film 57 is an aluminum nitride film. The substrate 55 is, according to one example, a silicon substrate, a sapphire substrate, an alumina substrate, a spinel substrate or a glass substrate.

According to another example, a configuration different from the configuration shown in FIG. 2 and FIG. 3 may be adopted as the acoustic wave resonator.

The number of stages of the ladder may be increased in order to lower the floor level of the ladder-type filter and the increased parallel arms may be divided in series for ensuring the power durability. It makes, however, the parallel arms larger and prevents the ladder-type filter from miniaturizing.

According to the ladder-type filter 1 in the first embodiment, it is possible to keep the floor level low while maintaining the miniaturization of the ladder-type filter because replacing the parallel arm P1 to a capacitor having no resonant property prevents the problem of the power durability by occurring displacement due to resonance makes unnecessary to divide the parallel arm P1.

It is possible to keep the effect to make the floor level low even if the parallel arm is replaced to the capacitor having no resonant property, because in the bandpass filter, the resonator is equivalent to the capacitor and a ladder circuit is composed of only the capacitors

Second Embodiment

FIG. 4 is a schematic view of the ladder-type filter 2 according to the second embodiment. As shown in FIG. 4, the ladder-type filter 2 includes an inductor L connected in series to the series arm S1. The inductor L can be formed by, for example, a microstrip line. The inductance of the inductor L is, for example, 0.7 nH.

The series arm S1 of the ladder-type filter 2 that the inductor L is serially connected to may have the highest resonant frequency or the second highest resonant frequency among the series arms. This improves attenuation of the band away from the passband of the ladder-type filter 2.

This improves, for example, attenuation in the band of the receiving filter constituting the duplexer together with the ladder-type filter 2 and the isolation characteristics are improved.

Further, it is possible to prevent the current from increasing by combining the inductor L and the capacitance of the parallel arm P1. Other configurations are the same as those of the ladder-type filter 1 in the first embodiment.

Third Embodiment

Figures 5, 6:
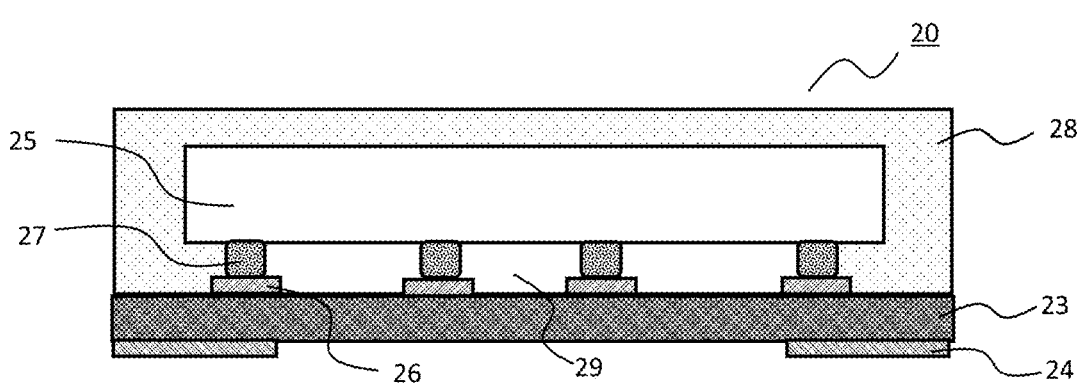

FIG. 5 is a longitudinal cross-sectional view of a duplexer according to the third embodiment.

As shown in FIG. 5, a duplexer 20 includes a wiring substrate 23, an external connection terminal 24, a device chip 25, an electrode pad 26, a bump 27, and a sealing portion 28.

The wiring substrate 23 is, for example, a multilayer substrate made of resin. The wiring substrate 23 is, for example, a low-temperature co-fired ceramic (LTCC) multilayer substrate includes multilayered dielectric.

The plurality of external connection terminals 24 are formed on the lower surface of the wiring substrate 23.

The plurality of electrode pads 26 are formed on the main surface of the wiring substrate 23. The electrode pad 26 is formed of, for example, copper or an alloy containing copper. The electrode pad 26 has a thickness of 10 μm to 20 μm for example.

The bumps 27 are formed on the upper surfaces of the electrode pads 26. For example, the bump 27 is made of gold. For example, the height of the bump 27 is 10 μm to 50 μm.

The air gap 29 is formed between the wiring substrate 23 and the device chip 25.

The device chip 25 is mounted on the wiring substrate 23 via the bumps 27 by flip-chip bonding. The device chip 25 is electrically connected to the plurality of electrode pads 26 via the plurality of bumps 27.

The device chip 25 includes, for example, a piezoelectric substrate formed of a piezoelectric material. The piezoelectric substrate is a substrate formed of a piezoelectric single crystal such as lithium tantalate, lithium niobate, or quartz. According to another example, the piezoelectric substrate is a substrate formed of piezoelectric ceramics.

The thickness of the piezoelectric substrate can be, for example, 0.3 μm to 5 μm.

In yet another example, the device chip 25 is a substrate in which a piezoelectric substrate and a support substrate are bonded to each other. The support substrate is, for example, a substrate formed of sapphire, silicon, alumina, spinel, quartz or glass.

For example, a plurality of acoustic wave elements (e.g. IDTs 51 and reflectors 52) are formed on the piezoelectric substrate. For example, on the main surface of the device chip 25, a ladder-type filter 1 according to the first embodiment or a ladder-type filter 2 according to the second embodiment is formed as a transmission filter and/or a receiving filter.

The transmission filter is formed so that an electrical signal of a desired frequency band can pass through. The transmission filter is, for example, a ladder-type filter including a plurality of series resonators and a plurality of parallel resonators.

The receiving filter is formed so that an electrical signal of a desired frequency band can pass through. The receiving filter is, for example, a ladder-type filter.

The sealing portion 28 is formed to cover the device chip 25. The sealing portion 28 is formed of, for example, an insulator such as a synthetic resin. The sealing portion 28 is formed of metal for example.

In case the sealing portion 28 is formed of a synthetic resin, the synthetic resin is an epoxy resin, polyimide, or the like. Preferably, the sealing portion 28 is formed of an epoxy resin using a low temperature curing process using an epoxy resin.

According to the duplexer of the third embodiment, it is possible to provide a duplexer including the ladder-type filter that can keep the floor level low while maintaining miniaturization with a simple configuration using fewer elements without causing the problem of the power durability.

Fourth Embodiment

FIG. 6 is a longitudinal cross-sectional view of a module that the ladder-type filter according to the first embodiment is applied to. The same reference numerals denote the same or corresponding elements in the embodiment 1, details of which are not explained herein.

In FIG. 6, a module 100 includes a wiring substrate 130, a plurality of external connecting terminals 131, an integrated circuit component IC, the ladder-type filter 1, an inductor 111, and a sealing portion 117. In addition, although not shown, the module 100 may include the ladder-type filter 2 according to the second embodiment or the duplexer 20 according to the third embodiment.

The plurality of external connecting terminals 131 are formed on the lower surface of the wiring substrate 130. The plurality of external connecting terminals 131 are mounted on a motherboard of a preset mobile communication terminal.

For example, the integrated circuit component IC is mounted inside the wiring substrate 130. The integrated circuit component IC includes a switching circuit and a low noise amplifier.

The ladder-type filter 1 is mounted on the main surface of the wiring substrate 130.

The inductor 111 is mounted on the main surface of the wiring substrate 130. The inductor 111 is implemented for impedance matching. For example, the inductor 111 is Integrated Passive Device (IPD).

The sealing portion 117 seals a plurality of electronic components including the ladder-type filter 1.

According to the fourth embodiment described above, it is possible to provide a module including the ladder-type filter that can keep the floor level low while maintaining miniaturization with a simple configuration using fewer elements without causing the problem of the power durability.

While several aspects of at least one embodiment have been described, it is to be understood that various modifications and improvements will readily occur to those skilled in the art. Such modifications and improvements are intended to be part of the present disclosure and are intended to be within the scope of the present disclosure.

It is to be understood that the embodiments of the methods and apparatus described herein are not limited in application to the structural and ordering details of the components set forth in the foregoing description or illustrated in the accompanying drawings. Methods and apparatus may be implemented in other embodiments or implemented in various manners.

Specific implementations are given here for illustrative purposes only and are not intended to be limiting.

The phraseology and terminology used in the present disclosure are for the purpose of description and should not be regarded as limiting. The use of "including," "comprising," "having," and variations thereof herein means the inclusion of the items listed hereinafter and equivalents thereof, as well as additional items.

The reference to "or" may be construed so that any term described using "or" may be indicative of one, more than one, and all of the terms of that description.

References to front, back, left, right, top, bottom, and side are intended for convenience of description. Such references are not intended to limit the components of the present disclosure to any one positional or spatial orientation. Accordingly, the foregoing description and drawings are by way of example only.

What is claimed is:

1. A ladder-type filter comprising:
   a plurality of series arms;
   a plurality of parallel arms; and
   a support substrate,
   wherein one of the plurality of the parallel arms is arranged in parallel between two series arm resonators of the plurality of series arms and does not have resonance properties,
   wherein the plurality of series arms and the plurality of parallel arms are formed on a piezoelectric substrate that is formed of a piezoelectric single crystal of lithium tantalate or lithium niobite,
   wherein the plurality of series arms and the plurality of parallel arms are formed on a main surface on the piezoelectric substrate,
   wherein the support substrate is mounted on a surface opposite of the main surface of the piezoelectric substrate, and
   wherein the support substrate comprises a substrate formed of sapphire, silicon, alumina, spinel, quartz or glass.

2. The ladder-type filter according to claim 1,
   wherein the one of the parallel arms having no resonance properties includes Interdigital Capacitor (IDC) electrodes.

3. The ladder-type filter according to claim 1,
   wherein one of the series arm resonators of the plurality of series arms connected in parallel with the one of the plurality of parallel arms having no resonance properties has the highest resonant frequency among the plurality of series arms.

4. The ladder-type filter according to claim 1, wherein an electrical signal is firstly applied to one of the series arm resonators of the plurality of series arms connected in parallel with the one of the plurality of parallel arms having no resonance properties among the plurality of series arms.

5. The ladder-type filter according to claim 1, wherein one of the series arm resonators of the plurality of series arms connected in parallel with the one of the plurality of parallel arms having no resonance properties is connected in series with an inductance element.

6. The ladder-type filter according to claim 1, wherein the plurality of series arms and the plurality of parallel arms except for the one of the plurality of parallel arms having no resonance properties each having a Interdigital Transducer electrodes.

7. The ladder-type filter according to claim 1, wherein the ladder-type filter is included in a duplexer.

8. The ladder-type filter according to claim 1, wherein the ladder-type filter is included in a module.

\* \* \* \* \*